United States Patent [19]

Bodle et al.

[11] 4,167,706

[45] Sep. 11, 1979

[54] TWO-WIRE FREQUENCY TO DC CONVERTER

[75] Inventors: Ronald L. Bodle, Northridge; Gareth B. Dolby, Van Nuys, both of Calif.

[73] Assignee: Moore Industries Inc., Sepulveda, Calif.

[21] Appl. No.: 874,038

[22] Filed: Jan. 31, 1978

[51] Int. Cl.² .................. H03K 5/00; H02M 7/00; H04B 1/12
[52] U.S. Cl. .................. 328/26; 328/165; 325/475; 328/18
[58] Field of Search .................. 328/165, 26, 18; 325/378, 475

[56] References Cited

U.S. PATENT DOCUMENTS 3,238,383  3/1966  Falk .................. 328/165 X
3,657,566  4/1972  Holt .................. 328/26 X Primary Examiner—John S. Heyman
Attorney, Agent, or Firm—Julius Louis Rubinstein

[57] ABSTRACT

A two-wire frequency to DC converter utilizes a multi-stage binary counter which is controlled by a crystal oscillator and the input frequency. This arrangement provides precisely shaped square wave pulses at the output of the counter whose frequency is functionally related to the input frequency and which can be fed into a low pass filter to obtain an average DC value for the AC input. The output terminal at each stage of the binary counter has a plurality of open terminals, each associated with a particular frequency. By connecting a single diode across a selected open terminal, the converter which is constructed without regard to any input frequency, so it can be mass-produced, can be easily customized for a particular input frequency range.

28 Claims, 4 Drawing Figures

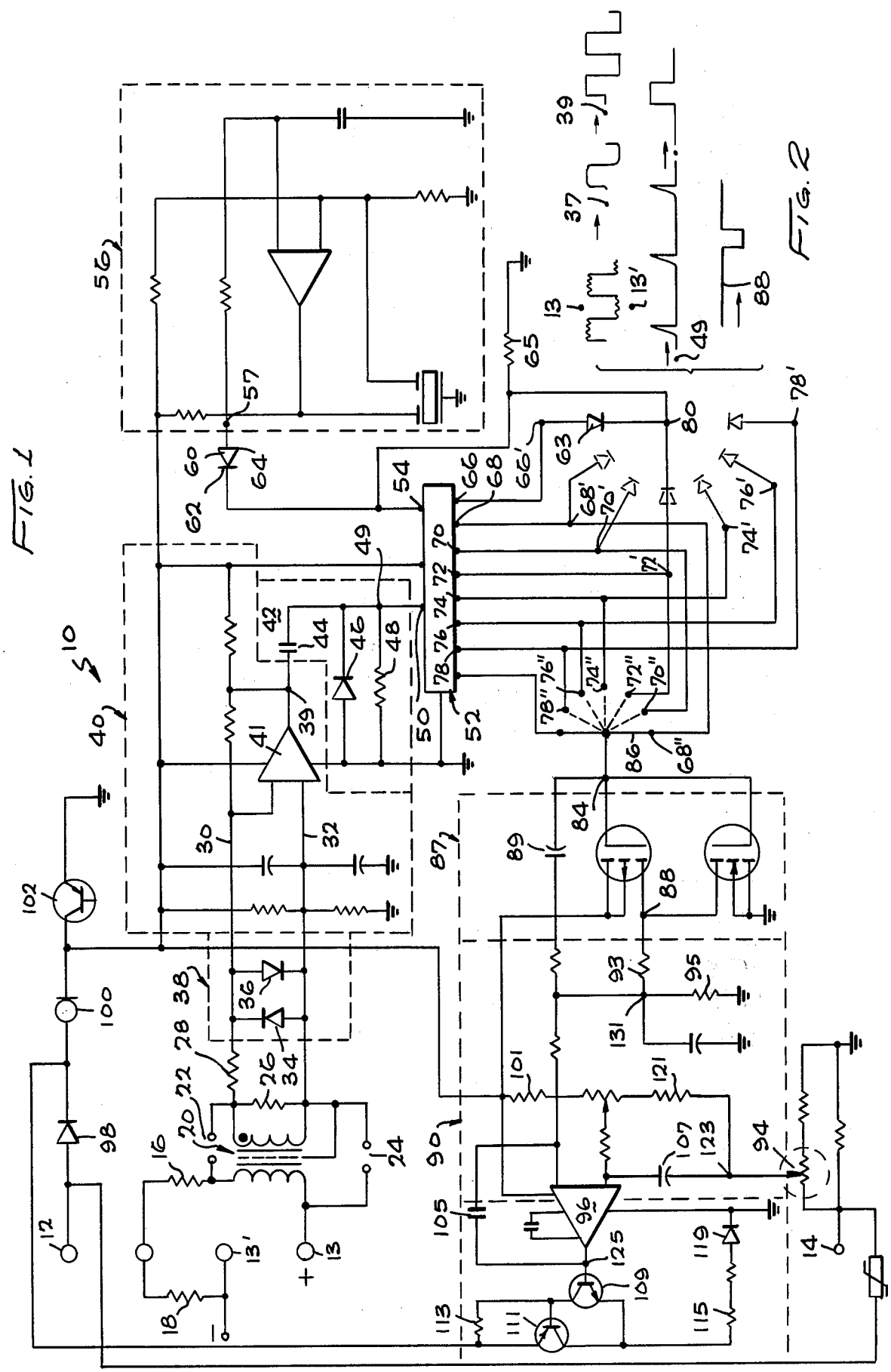

TWO-WIRE FREQUENCY TO DC CONVERTER

TWO-WIRE FREQUENCY TO DC CONVERTER

This invention relates generally to a two-wire frequency to DC converter, which is constructed without regard to the input frequency but which can be easily customized to receive a particular input frequency range.

BACKGROUND AND BRIEF SUMMARY

There is a need for low cost compact instrumentation which can accept frequency input signals having any wave form and frequency and convert it to a DC current whose magnitude is precisely related to the input frequency. This suggests a two-wire system wherein the power input leads also carry the output signal. Such an arrangement is compact and easy to install with little chance for error in installation because the number of leads to be connected is minimized.

Considerations of cost make it desirable for the frequency to DC instrumentation to be constructed without regard to the input frequency. However, design considerations require each circuit to be constructed to receive a particular input frequency range. These contradictory demands are reconciled in this case through the use of a clock controlled binary counter. This is because such counters have a plurality of output stages, each associated with a particular frequency.

In a binary counter, a square wave pulse appears at the output terminal of each stage when the count of pulses from the clock or oscillator to the binary counter has achieved a number corresponding to the stage. The circuit is designed to these various output stages lead into separate standardized open terminals. These terminals are designed to be completed by the connection of a single diode across them. By connecting the diode across a particular open terminal, the circuit will be customized to receive a particular input frequency range.

Since the frequency input can have a wide variety of wave forms, considerations of accuracy, and sensitivity to temperature variation, and compactness, suggest the use of a crystal oscillator such as described in the 1976 printing of the National Linear Data Book, published by National Semiconductor Corporation, pages 5–33, to be used with the binary counter. Similarly, accuracy requires a highly stable voltage supply, which is likewise independent of frequency and temperature. That is satisfied in this case through the use of a power supply employing, inter alia, a Zener diode. The Zener controlled power supply is used to achieve a highly stable voltage supply which is independent of temperature. Thus, the combination of a crystal oscillator, a highly stable Zener controlled power supply and a binary counter makes possible a very accurate transformation of a frequency input to a DC output.

What is needed, therefore, and comprises an important object of this invention is to provide a two-wire frequency to DC converter which has a standardized output value and which can convert an input frequency having a large variety of wave forms to a highly accurate DC output.

A further object of this invention is to provide a single two-wire frequency to DC converter which can be massproduced but which can be easily customized for a particular input frequency range.

These and other objectives of this invention will become more apparent when better understood in the light of the accompanying specification and drawings, wherein:

FIG. 1 is a circuit diagram of the two-wire frequency to DC converter, constructed according to the principles of this invention.

FIG. 2 is a diagram showing the wave forms in the circuit of FIG. 1 up to the binary counter.

Figure 4:
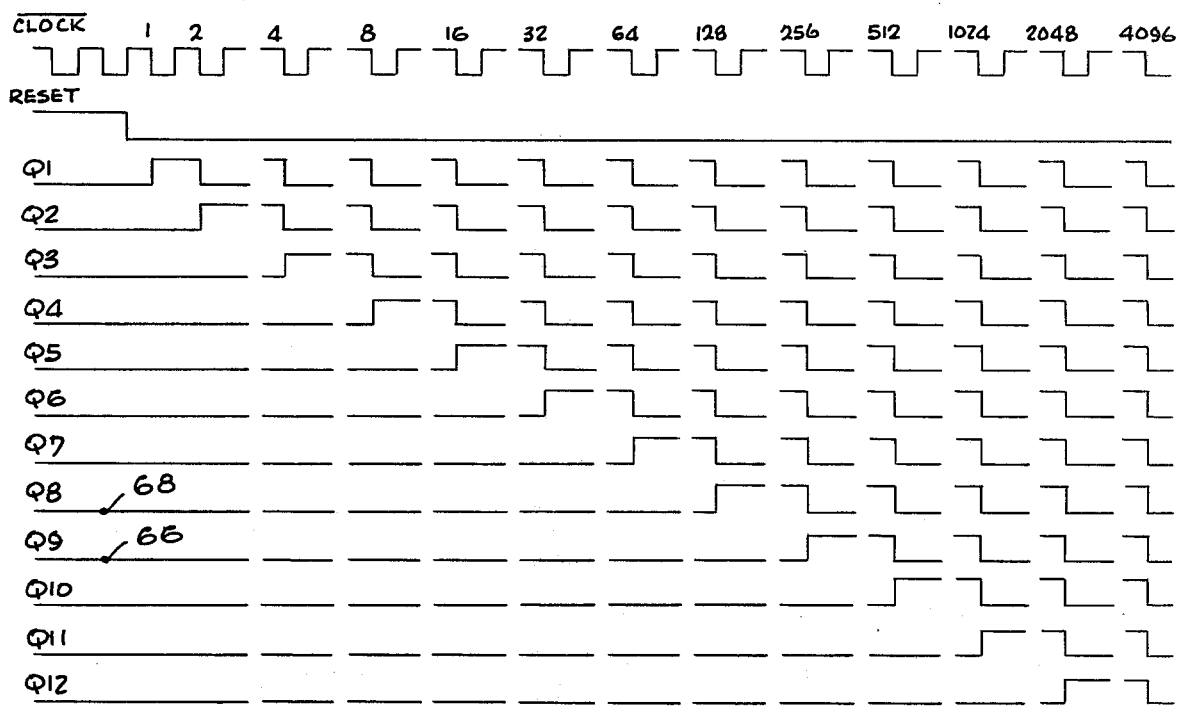
FIG. 4 shows the wave forms at the various stages of the 12 stage binary counter used in this embodiment.

Referring now to FIG. 1 of the drawing, a two-wire frequency to DC converter circuit indicated generally by the reference numeral 10 is provided with frequency input terminals 13 and 13'. Power is fed into the circuit at terminals 12 and 14 which, as will become apparent, carry the output signal.

The input signals at terminals 13 and 13' pass through voltage dropping resistors 16 and 18 and, if desired, pass through a signal transformer 20 which isolates the DC component of the signal in a manner well known in the art. In the event the transformer is not needed for a specific application, the circuit is built with jumpers 22 and 24 which act to bypass the transformer.

The output signals from the transformer pass through resistors 26 and 28 which are selected to terminate the transmission line and to establish the correct voltage relationship between busses 30 and 32 at their entry into a conventional amplitude limiting network 38 comprising signal diodes 34 and 36.

Network 38 has the function of shaping the frequency signal, (see FIG. 2 at terminal 13) to an approximate square wave at its output terminal 37 so it is more suitable for really precise control. To do this, the roughly square wave signal at terminal 37 is fed into the wave shaping circuit 40 built around a solid state voltage comparator 41 in a manner well known in the art. This circuit shapes the signal from terminal 37 and forms a precise square wave at its output terminal 39 which has the same frequency as the original AC input signal. The precise shape of the signal at terminal 39 provides a more accurate timing control, as will become more apparent below.

The output of circuit 40 at terminal 39 is fed into a conventional differentiating circuit 42, which includes a 10 pf capacitor 44, a diode 46, and a 1 meg. resistor 48. This differentiating circuit transforms the square wave from terminal 39 to a spiked wave shape at terminal 49 (see FIG. 2). The time separation between each spike is equal to the wave length of the original AC input signal. This information is used to determine the average DC output level which the converter is designed to extract.

The spiked output signal at terminal 49 is fed into the reset terminal 50 of a binary counter 52, which in this embodiment happens to be a 12 stage binary counter, such as described in the 1975 RCA (SSD-203 C) COS/MOS integrated circuits, page 200 from the Data Book Series, wherein each stage responds to a down-going transition of a previous stage in a manner well known in the art.

In this embodiment the reset frequency is equal to the signal input frequency. It is understood, however, that the reset frequency could under some circumstances be a multiple M of the signal input frequency where M can be a whole number or a fraction.

In order to operate the binary counter, a clock is needed. In this embodiment, the clock is in the form of a crystal oscillator 56 which is selected for reasons of accuracy, compactness and insensitivity to temperature variations over a reasonable range ($-20°$ F. to $180°$ F.). The output of oscillator 56 at terminal 57 in the form of square wave pulses (see FIG. 3) is passed through diode 60 to the clock input terminal 54 of the binary counter. The diode 60 is part of an OR gate which includes diode 63 and resistor 65.

The diode 60 acts like a closed switch as long as its cathode 62 is more negative than its anode 64. When this happens, the pulses from the clock or oscillator 56 are free to go to terminal 54 of the binary counter 52. This causes the binary counter to count the pulses. When the number of counts predetermined by the stage selection has been achieved, that stage of the counter produces a pulse whose free-running frequency is equal to $F/2^n$ pulses from the clock, where n is the number of the stage to be used and F is the frequency of the clock.

In this particular embodiment, terminals 66 and 68 are used, where terminal 68 is the stage in the counter immediately before the stage of terminal 66. The stage connected to terminal 66 responding to a down-going transition of the stage connected to terminal 68 when the number of counts has been achieved, causes the output terminal 66 to rise (see FIG. 3). This makes diode 63 conductive, which causes terminal 54 to go high, effectively raising the cathode 62 of diode 60 higher than the anode 64. This makes diode 60 non-conductive and effectively opens the circuit to break the electrical connection between the clock and the binary counter, causing the binary counter to stop.

This condition is stable and remains so until the next reset pulse or spike from terminal 49 appears at terminal 50 and drives everything, including terminal 66, low. This makes diode 63 non-conductive, causing terminal 54 to go low so cathode 62 is lower than diode 64 thus reconnecting the clock 56 to the binary counter 52 to start the connecting sequence again. The pulse width at terminal 68 is a portion of the interval between the reset pulses (see FIG. 3), but the frequency of this pulse is the same as the frequency of the input signal.

As described above, the binary counter is provided with a plurality of outputs. As shown in FIG. 4, the output free-running frequency at each stage is one-half the frequency of a succeeding stage, and in a twelve-stage counter, the output frequency of the twelfth stage is $F/2^{12}$ of the frequency F of the clock. This amounts to a free-running frequency which is 1/4096 times the clock frequency which in this embodiment is 100,000 cps. Consequently, as shown in FIG. 4, the output terminals of the binary counter offer a large choice of free-running frequencies. However, the binary counter must have at least one stage with a free-running output frequency greater than the input frequency range. Space requirements require the drawing shown in FIG. 4 to be shortened. This is indicated by the breaks in the wave forms, which indicate omitted pulses. It is understood, for example, Q12 would not respond until the counter receives 4096 pulses from the clock. Stage 11 requires 2048 pulses from the clock, etc.

To provide for maximum overranging capability along with temperature stability, the output stage of the counter most nearly corresponding to an output frequency of four times the signal input frequency is selected for use. For example, if the input frequency were about 100 cycles per second, free-running frequency of stage 8 of the counter corresponding to 1/256 of the oscillator frequency would be selected as it is in this embodiment ($100,000 \div 256 = 396$). This would, as shown in FIG. 3, give a pulse width at terminal 66 which is ⅛ of the interval between the reset spikes and the input signal frequency.

Figure 3:
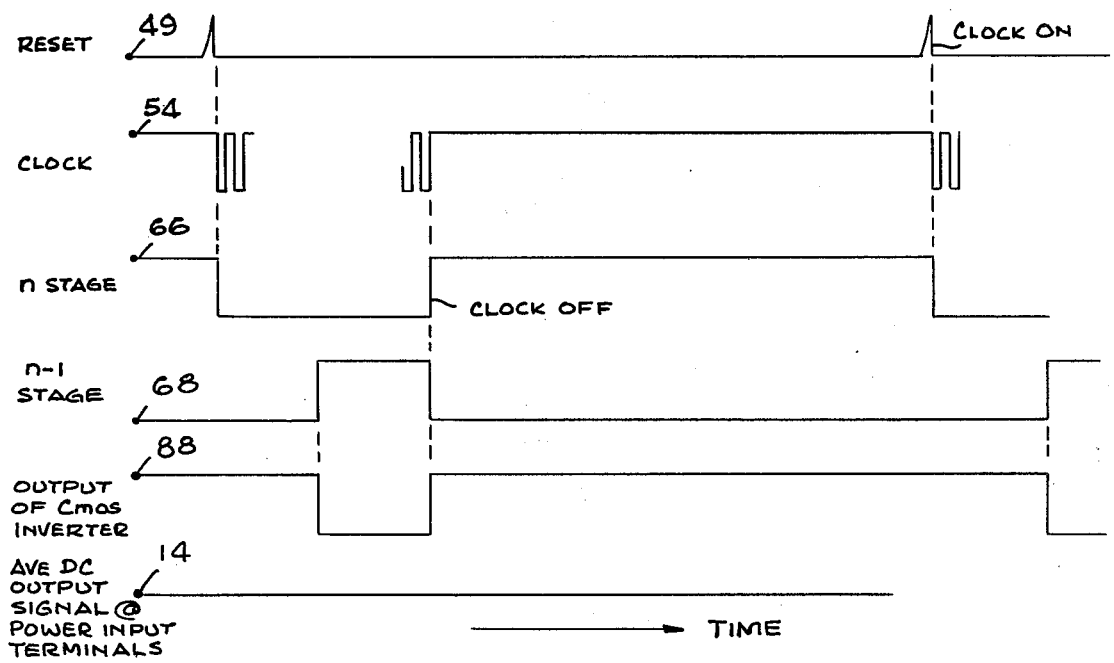
FIG. 3 shows the relationship between the wave forms as a function of time from the output of the binary counter to the output of the converter.

As stated above and as seen in FIGS. 3 and 4, it is clear that a reset pulse at terminal 50 drives everything in the counter low and connects the clock 56 to the counter so the counter starts to function. When 256 pulses are counted (corresponding to the requirement of terminal 66), terminal 66 responding to a down-going transition of a preceding stages rises (see FIGS. 3 and 4). This, as explained above, turns off the clock connected to the counter until the next reset pulse occurs. However, and this is important, the adjacent preceding stage had similarly responded to a down-going transition of its preceding stage, which occurred after 128 pulses from the clock. Consequently, the next preceding stage, which in this embodiment is associated with terminal 68, is one-half the width and opposite in phase to the signal at terminal 66 (see FIG. 3).

In this embodiment, the output signal from the counter, at terminal 66, is used to control the operation of the binary counter and the output signal at terminal 68 of the adjacent stage as will be described below is used to obtain a DC value which is a precise measure of the input frequency. Although it might be possible to use output terminals of stages of the counter which are not adjacent to each other for counter control and current measurement, the advantage of using adjacent stages is that it provides a maximum overranging capability for the circuit. Without using the adjacent stages, it might be possible for an input signal which is at a much higher frequency to cause the circuit to react as though the input frequency were in effect a very low frequency. This would occur if the interval between the reset pulses were less than the pulse width of the stage used to control the counter through diodes 60 and 63.

The circuit 10 described in FIG. 1 is constructed independently of the frequency input. This is advantageous from the standpoint of economy. However, considerations of accuracy and problems in overranging require the circuit to be customized for a particular input frequency. To do this, each output stage of the binary counter has open terminals connected to it. For example, the counter output signal at terminal 66 is connected to terminal 66', terminal 68 to terminals 68' and 68", etc. Diode 63, which is part of the OR gate described above, is, in the embodiment shown, connected between terminal 66' and common terminal 80. This diode could also have been connected between terminal 68' and 80 or 70' and 80, etc., depending on the signal input frequency. In this way, a universal circuit suitable for mass production can be quickly and easily customized for a particular input frequency range. Although in this embodiment, a diode 63 is used as part of an OR gate to control the counter, other control gates might be used so that other electrical devices besides a diode could be used to customize the converter.

In the embodiment shown, terminal 66 is used for counter control and the signal at terminal 68 is used to obtain a DC current precisely related to the input frequency. To do this, terminal 68 is connected to common terminal 84 through terminal 68" and jumper 86. If the diode 63 were connected across terminal 68 (the next preceding stage), then jumper 86 would be connected between terminal 70" and terminal 84. As seen in FIG.

3, the frequency of the pulses at terminal 68 and at terminal 84 will be precisely equal to the frequency of the AC input signal. Consequently, it is clear that an averaging circuit can be used to obtain a DC value for this frequency.

The signal at terminal 84 from the counter is passed through a conventional complementary symmetry CMOS inverter 87 described more fully in the book RCA Solid State "Understanding CMOS" (CP 1-279), page 9, published by RCA Corp., to invert the signal from terminal 84 and to get the amplitude of these pulses independent of temperature fluctuations (see FIG. 3). This invention is necessary for all practical purposes, because if an average DC current is to be obtained, considerations of accuracy require the current to be as large as possible. Without inversion, the DC average of the tiny pulses appearing at terminal 84 would be at or near zero, so that an amplifier could not operate from it. Inversion, however, raises the average DC to a more practical value. This complementary CMOS inverter also provides the pulses with a a very stable amplitude because it is fed by the Zener controlled power supply as described below.

The CMOS inverter 87 described above has a combined function in that it is also used to eliminate the AC component from the signal at terminal 84. The signal at terminal 84 at the input to the inverter moving through a first path is equal and opposite in phase to the signal at terminal 88 at the output of the inverter. Advantage is taken of this inversion by channeling the signals from terminal 84 to a second path around the inverter through a one microfarad decoupler capacitor 89 which eliminates the DC component from the pulse signal at terminal 84, leaving only the AC signal to appear at terminal 131. The inverted signal at terminal 88 is passed through resistor 93 to terminal 131 where it is added to the signal from the decoupler capacitor 89. The signal from terminal 88 contains a DC component passing through the capacitor 89. When these signals are added at terminal 131, the AC signals cancel out leaving only the DC component. The output of the inverter 87 at terminal 88 is passed through a low pass filter network 90.

This DC component also contains the voltage $E_z$ from the Zener power supply and to get a true average DC value for the frequency input, this voltage from the power supply must be subtracted from the DC component at terminal 88 in order to null out the voltage effect of the Zener in a manner well known in the art. This is done through the use of a differential amplifier which employs 100 K resistors 93, 95, 101 and 121, along with the operational amplifier 96, and the effect is to subtract the Zener voltage $E_z$ from the DC component at terminal 88. This subtracted voltage appears at terminal 123. To further filter out the signal at terminal 123, a one mmf capacitance 107 and a 0.0022 mmf capacitance 105 provides an out-of-phase AC feedback, which has the effect of smoothing out the signal at 123. This signal is then amplified by signal transistors 109 and 111 which are controlled by the 20 K biasing resistor 113. The amplified signal appearing at terminal 125 passes through resistor 115, which is selected to control the output current to the customer's satisfaction, and these pass through a biasing signal diode 119 which controls the signal transistors. Thus, the frequency at input terminals 13 and 13' has been precisely converted to a functionally related DC voltage. This voltage appears at the power input terminals 12 and 14.

Convention requires that the output signals from the converter be from 4 to 20 milliampers in strength or 10 to 50 milliampers in strength, depending on customer preference. In order to get full-scale deflection for a particular input frequency range after the diode 63 has been appropriately positioned, a zero frequency input is inserted at input terminals 13 and 13'. The potentiometer 92 is then adjusted to get a 4 or 10 ma. output. Then, to get a full-scale deflection for the particular input frequency, the maximum frequency likely to be encountered is connected across terminals 13 and 13' and the potentiometer 94 is adjusted to get the 20 or 50 milliampers deflection on the meter. These adjustments in combination with the function of the operational amplifier 96 adjust the DC current output at terminals 12 and 14 to the proper level.

As stated above, accuracy in the conversion from the AC input signal to the DC output signal which appears across the power terminals 12 and 14 requires a very stable temperature and sensitive power supply. This is achieved through the use of a forward biased diode 98 connected to terminal 12. The forward biased diode, used for current protection, leads to a constant current diode 100 such as diode #CR 300 from Siliconix Corporation, and this is passed on through a grounded Zener diode 102 such as IN 825 to provide a temperature stable constant voltage supply. This constant voltage supply along with the crystal oscillator and binary counter is responsible for the accurate conversion of the frequency input to a DC voltage at terminals 12 and 14.

Having described the invention, what is claimed is:

1. In a frequency to DC converter, a multi-stage binary counter, said binary counter having a clock input terminal and a reset terminal for receiving reset pulses whose frequency is a multiple of the signal input frequency, an oscillator and a control gate, said oscillator connected to said clock input terminal through said control gate, each stage of said binary counter having an output terminal where a square wave pulse appears when the count of pulses from the oscillator to the binary counter has achieved a number corresponding to that stage, at least one stage of said binary counter having a full-running output frequency which is greater than the input frequency range, means for customizing the converter for a particular input frequency range, said means including an open terminal connected to the output terminal of each stage of the binary counter, each open terminal associated with a common terminal, said common terminal connected to said control gate, said control gate including an electrical device connected across the open terminal connected to the output terminal of said at least one stage and said common terminal, said electrical device selected so that after the count of pulses from the oscillator to the counter has achieved a number corresponding to the stage associated with the open terminal to which the electrical device is connected, a pulse appears at the first open terminal of said at least one stage and causes said electrical device to affect said control gate in such a way that it disconnects the oscillator from the clock input terminal until the next reset pulse whereby the frequency of the pulses at said at least one stage is equal to the frequency of the reset pulses and the frequency and pulse width of the output pulses at each stage of the binary counter is functionally related to the input frequency to the converter, the output terminal of a second stage of said binary counter before said at least one stage connected to a current averaging device to convert the pulses appearing at the output terminal of said second stage to a DC value whose magnitude is precisely related to the signal input frequency.

2. The frequency to DC converter described in claim 1 wherein the frequency of the reset pulses at the reset terminal of the binary counter is equal to the signal input frequency.

3. The frequency to DC converter described in claim 1 wherein said oscillator is a crystal oscillator.

4. The frequency to DC converter described in claim 1 wherein the binary counter is selected so it has a sufficient number of stages so that at least one of said stages has a free-running frequency most nearly corresponding to four times the input frequency and said electrical device is connected to the output terminal of said at least one stage.

5. The frequency to DC converter described in claim 1 including a Zener power supply connected to said binary counter, to said current averaging device, and to said oscillator to provide the DC value whose magnitude is precisely related to input frequency to be independent of temperature variations.

6. The frequency to DC converter described in claim 1 wherein said converter has signal input terminals and power input terminals, the average DC output of said current averaging device connected to said power input terminals.

7. The frequency to DC converter described in claim 1 wherein said second stage of said binary counter is the output stage of the binary counter immediately preceding said first stage.

8. The frequency to DC converter described in claim 1 including the means for shaping the frequency input to a precisely shaped square wave signal whose frequency is equal to the signal input frequency, and a differentiating circuit having an input and output terminal, said precisely shaped square wave pulses connected to the input of the differentiating circuit, the output of said differentiating circuit, in the form of spiked pulses whose frequency is equal to the frequency of the input signal, said output spiked pulses of the differentiating circuit connected to said reset terminal of said binary counter.

9. The frequency to DC converter described in claim 1 wherein said current averaging device includes an inverter circuit having an input terminal and an output terminal defining a first signal path therebetween, a second signal path around said inverter circuit between said input terminal and said output terminal, means in said second signal path for transmitting the AC component of the signal at the input terminal but eliminating the DC component of the signal, said inverter circuit transmitting said DC component of the signal to said output terminal but inverting the AC component whereby the AC component at the output terminals from the first path and said second path cancel each other leaving only the DC component.

10. The frequency to DC converter described in claim 9 including the means for amplifying the DC component to a level determined by convention and customer requirements.

11. In a frequency to DC converter, a signal input terminal and power input terminal, a Zener power supply connected to said power input terminals to make the DC conversion independent of temperature variations, means connected to said signal input terminals for converting the frequency input to a precisely shaped square wave signal whose frequency is equal to the signal input frequency, a differentiating circuit, said differentiating circuit having an input terminal and an output terminal, said precisely shaped square wave pulses connected to the input terminal of said differentiating circuit, said differentiating circuit shaping said precisely shaped square wave pulses to spiked pulses having a frequency equal to the frequency of the input signal, said spiked pulses appearing at the output terminal of said differentiating circuit, a multistage binary counter, said binary counter having a clock input terminal and a reset terminal for receiving reset pulses whose frequency is equal to the signal input frequency, the output terminal of said differentiating circuit connected to said reset terminal of said multistage binary counter, a crystal oscillator and a control gate, said crystal oscillator connected to said clock terminal of said multistage binary counter through said control gate, each stage of said multistage binary counter having an output terminal means for customizing the converter for a particular input frequency range, said means including open terminals connected to the output terminals of each stage of the binary counter, each open terminal associated with a common terminal, said common terminal connected to said control gate, said control gate including an electrical device adapted to be connected to a first output terminal and a common terminal whereby after the pulses from the oscillator to the counter had achieved a number corresponding to the stage connected to the open terminal to which the electrical device is connected, a pulse appears at said output terminal which causes said control gate to disconnect the oscillator from the clock input terminal until the next reset pulse occurs whereby the frequency of the pulses at said first output terminal is equal to the frequency of the spiked pulses and the input frequency, and the frequency and pulse width of each stage of the binary counter is functionally related to the input frequency to the converter, said device connected to the output terminal of the binary counter which has a full-running frequency most nearly corresponding to four times the signal input frequency, so that by connecting the electrical device across the open terminal connected to the stage whose output frequency is nearest to four times the signal input frequency range, the frequency to DC converter will be customized for a particular input frequency range, the output terminal of the stage of said binary counter immediately before said first stage connected to a current averaging device to convert the pulses appearing at the output terminal of said second stage to a DC value whose magnitude is precisely related to the input frequency, said current averaging device including an inverter circuit having an input terminal and an output terminal defining a first signal path therebetween, a second signal path around said inverter circuit between said input terminal and said output terminal, means in said second signal path for transmitting the AC component of the signal at the input terminal but eliminating the DC component of the signal, said inverter circuit transmitting said DC component to said output terminal but inverting the AC component whereby the AC component at the output terminals from said first and second paths cancel out leaving only the DC component at the output terminal, and means for amplifying the DC component at said output terminal to a level determined by convention and customer requirements.

12. In a frequency to DC converter, a multistage binary counter, said binary counter having a clock input terminal and a reset terminal for receiving reset pulses whose frequency is a multiple of the signal input frequency, an oscillator and a control gate, said oscillator connected to said clock input terminal through said control gate, each stage of said binary counter having an output terminal where a square wave pulse appears when the count of pulses from the oscillator to the binary counter has achieved a number corresponding to that stage, said binary counter having at least one stage whose free-running output frequency is greater than the input frequency range, means for customizing the converter for a particular input frequency range, said means including first and second terminals connected to the output terminals of the binary counter, a first and second common terminal associated with the first and second open terminals respectively, said first common terminal connected to said control gate, said control gate including an electrical device adapted to be connected across a first open terminal connected to the output terminal of said at least one stage and to the first common terminal, said electrical device selected so that after the count of pulses from the oscillator to the counter has achieved a number corresponding to said at least one stage, a pulse appearing at the output terminal of said at least one stage causes said electrical device to affect the control gate in such a way that it disconnects the oscillator from the clock input terminal until the next reset pulse appears whereby the frequency of the pulses at said at least one terminal is equal to the frequency of the reset pulses and the frequency and pulse width of each stage of the binary counter is functionally related to the input frequency to the connector, the second common terminal of the second open terminal connected to a current averaging device, a jumper, said jumper connected across the second open terminal connected to the output terminal of another stage of said binary counter before said at least one stage and said second common terminal, so that by connecting the electrical device across said first open terminal connected to the output terminal whose frequency is greater than the input frequency range and with a jumper connected across a second open terminal of said another stage and said second common terminal, the circuit will be customized for a particular input frequency range, said current averaging device converting the pulses appearing at the output terminal of said another stage to a DC value whose magnitude is precisely related to the signal input frequency.

13. The frequency to DC converter described in claim 12 wherein said control gate is an OR gate and wherein said electrical device is a diode which is part of said OR gate.

14. The frequency to DC converter described in claim 12 wherein the frequency of the reset pulses at the reset terminal of the binary counter is equal to the signal input frequency.

15. The frequency to DC converter described in claim 12 wherein said oscillator is a crystal oscillator.

16. The frequency to DC converter described in claim 12 wherein the binary counter is selected so it has a sufficient number of stages so that said one stage has a free-running output frequency most nearly corresponding to four times the input frequency.

17. The frequency to DC converter described in claim 12 including a Zener power supply connected to said binary counter, to said current averaging device, and to said oscillator, to provide a DC value whose magnitude is precisely related to the input frequency and is independent of temperature variations.

18. The frequency to DC converter described in claim 12 wherein said converter has signal input terminals and power input terminals, the average DC output of said current averaging device connected to said power input terminal.

19. The frequency to DC converter described in claim 12 wherein said second stage of said binary counter is the output stage of the binary counter immediately preceding said first stage.

20. The frequency to DC converter described in claim 12 including means for shaping the frequency input to a precisely shaped square wave signal whose frequency is equal to the signal input frequency, and a differentiating circuit having an input and output terminal, said precisely shaped square wave pulses connected to the input of the differentiating circuit, the output of said differentiating circuit in the form of spiked pulses whose frequency is equal to the frequency of the input signal, said output spiked pulses of the differentiating circuit connected to said reset terminal of said binary counter.

21. The frequency to DC converter described in claim 12 wherein said current averaging device includes an inverter circuit having an input terminal and an output terminal defining a first signal path therebetween, a second signal path around said inverter circuit between said input terminal and said output terminal, means in said second signal at the input terminal of the inverter circuit but eliminating the DC component of the signal, said inverter circuit transmitting said DC component of the signal to said output terminal but inverting the AC component whereby the AC component at the output terminals from the first path and the second path cancel each other, leaving only the DC component.

22. In a frequency to DC converter, a multistage binary counter, said binary counter having a clock input terminal and a reset terminal for receiving reset pulses whose frequency is a multiple of the signal input frequency, an oscillator and a control gate, said oscillator connected to said clock input terminal through said control gate, each stage of said binary counter having an output terminal, means for customizing the converter for a particular input frequency range, said means including open terminals connected to the output terminal of each stage of the binary counter, each open terminal associated with a common terminal, said common terminal connected to said control gate, said control gate including an electrical device adapted to be connected across a first output terminal and a common terminal, said electrical device selected so that after the count of pulses from the oscillator to the counter has achieved a number corresponding to the stage associated with the open terminals to which the electrical device is connected, a pulse appearing at said first output terminal causes said electrical device to affect said control gate in such a way that it disconnects the oscillator from the clock input terminal until the next reset pulse appears, so that by connecting the electrical device across the open terminal connected to the stage whose free-running output frequency is higher than the input frequency range, the circuit will be customized for a particular input frequency range, the frequency of that stage to be equal to the reset frequency, and the output terminal of a second stage of said binary counter before the first stage connected to a current averaging device to convert the pulses appearing at the output terminal of said second stage to a DC value whose magnitude is precisely related to the signal input frequency.

23. The frequency to DC converter described in claim 1 wherein said current averaging device includes combined means for raising the average DC value of the signal at the output terminal of said second stage of the binary counter to a higher value and for eliminating the AC component of the signal from that stage.

24. The frequency to DC converter described in claim 23 wherein said combined means includes an inverter circuit with a second path around said inverter circuit.

25. The frequency to DC converter described in claim 12 wherein said current averaging device includes combined means for raising the average DC value at the output terminal of said another stage of the binary counter to a higher value, and for eliminating the AC component of the signal at the output terminal of said another stage.

26. The frequency to DC converter described in claim 25 wherein said combined means include an inverter circuit with a second path around said inverter circuit.

27. The frequency to DC converter described in claim 22 wherein said current averaging device includes combined means for raising the average DC value at the output terminal of said second stage of the binary counter to a higher value and for eliminating the AC component of the signal from that stage.

28. The frequency to DC converter described in claim 27 wherein said combined means includes an inverter circuit with a second path around said inverter circuit for eliminating the AC component of the signal at the output terminal of said second stage of the binary counter.

* * * * *